(12) United States Patent
Yamamoto et al.

(10) Patent No.: US 7,826,032 B2
(45) Date of Patent: Nov. 2, 2010

(54) CIRCULATION SYSTEM FOR HIGH REFRACTIVE INDEX LIQUID IN PATTERN FORMING APPARATUS

(75) Inventors: Taro Yamamoto, Koshi (JP); Hitoshi Kosugi, Koshi (JP); Yoshiaki Yamada, Tokyo (JP); Yasuhito Saiga, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 475 days.

(21) Appl. No.: 11/778,412

(22) Filed: Jul. 16, 2007

(65) Prior Publication Data
US 2008/0018868 A1 Jan. 24, 2008

(30) Foreign Application Priority Data
Jul. 18, 2006 (JP) .............................. 2006-196140

(51) Int. Cl.
G03B 27/42 (2006.01)
G21K 5/10 (2006.01)
(52) U.S. Cl. .............................. 355/30; 355/27; 355/53; 396/611; 438/908
(58) Field of Classification Search ................... 355/30, 355/53, 77, 27, 72; 134/1.1, 1.2, 1.3; 156/345.1, 156/345.31, 345.32; 396/611; 438/907, 438/908, 909
See application file for complete search history.

(56) References Cited

U.S. PATENT DOCUMENTS

2005/0208419 A1* 9/2005 Inabe et al. .............. 430/270.1
2006/0231206 A1 10/2006 Nagasaka et al.
2007/0182896 A1* 8/2007 Adelman et al. ............. 349/117
2008/0239260 A1* 10/2008 Shiraishi ....................... 355/30

FOREIGN PATENT DOCUMENTS

| JP | 05267266 A | * | 10/1993 |
| JP | 2006-80403 | | 3/2006 |
| WO | WO 2005122218 A1 | * | 12/2005 |

OTHER PUBLICATIONS

"Development of new high refractive index liquid (Delphi) for next-generation immersion light exposure in semiconductor manufacturing,—realizing micro-fabrication of 32 nano-meter line width", Mitsui Chemicals, Inc., Sep. 12, 2005, 4 pages <http://www.mitsui-chem.co.jp/whats/2005_0912.htm>.

* cited by examiner

Primary Examiner—Hung Henry Nguyen
Assistant Examiner—Colin Kreutzer
(74) Attorney, Agent, or Firm—Oblon, Spivak, McClelland, Maier & Neustadt, L.L.P.

(57) ABSTRACT

A circulation system for a high refractive index liquid includes a first collecting section configured to collect a high refractive index liquid used in an immersion light exposure section; a first supply section configured to supply the high refractive index liquid collected in the first collecting section to a cleaning section as a cleaning liquid; a second collecting section configured to collect the high refractive index liquid used in the cleaning section; and a second supply section configured to supply the high refractive index liquid collected in the second collecting section to the immersion light exposure section, wherein the high refractive index liquid is circulated between the immersion light exposure section and the cleaning section.

8 Claims, 7 Drawing Sheets

CIRCULATION SYSTEM FOR HIGH REFRACTIVE INDEX LIQUID IN PATTERN FORMING APPARATUS

BACKGROUND OF THE INVENTION

1. Field of the Invention

The present invention relates to a circulation system for a high refractive index liquid, used for circulating the high refractive index liquid in a pattern forming apparatus that includes a resist coating/developing section and an immersion light exposure section. The resist coating/developing section is structured to perform resist coating on a substrate, such as a semiconductor substrate, and development after light exposure. The immersion light exposure section is structured to subject a resist film formed on the substrate to light exposure in accordance with a predetermined pattern while immersing the resist film in the high refractive index liquid. The present invention further relates to a pattern forming apparatus and pattern forming method using a circulation system for a high refractive index liquid.

2. Description of the Related Art

In the process of manufacturing semiconductor devices, photolithography techniques are used for forming circuit patterns on semiconductor wafers. Where a circuit pattern is formed by use of photolithography, the process steps are performed, as follows. Specifically, a resist liquid is first applied to a semiconductor wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on semiconductor wafers. As a photolithography technique for realizing a high resolution of a 45-nm node level, there has been proposed the following immersion light exposure (for example, see U.S. Patent Application Publication No. US 2006/0231206 A1). In this immersion light exposure, a light exposure liquid, such as purified water, having a refractive index higher than air is supplied between the semiconductor wafer and light exposure projection lens. The wavelength of light radiated from the projection lens is shortened by means of the refractive index of the light exposure liquid, so that the line width obtained by the light exposure is decreased. Further, in order to attain a higher resolution, there has been proposed a technique for performing immersion light exposure while using a high refractive index liquid as a light exposure liquid (see "Development of new high refractive index liquid (Delphi) for next-generation immersion light exposure in semiconductor manufacturing,—realizing micro-fabrication of 32 nanometer line width—," Sep. 12, 2005, Mitsui Chemicals, Inc. (authorship unknown); Internet [mitsui-chem.co.jp/whats/2005_0912.htm]). According to this technique, the high refractive index liquid is formed of a liquid compound comprising a cyclic hydrocarbon skeleton and having a higher refractive index than purified water, with which a high resolution of a 32-nm node level is realized.

In general, cleaning (or rinsing) of a semiconductor wafer is performed by use of a cleaning liquid (or rinsing liquid), such as purified water, before and after immersion light exposure (for example, see Jpn. Pat. Appln. KOKAI Publication No. 2006-80403). Cleaning performed before immersion light exposure is conceived to improve the affinity relative to the light exposure liquid. Cleaning performed after immersion light exposure is conceived to remove part of the light exposure liquid left on the semiconductor wafer.

However, where a high refractive index liquid is used as a light exposure liquid, as described above, the conventional cleaning may bring about following problems. Specifically, in the case of cleaning performed before immersion light exposure, the cleaning liquid and light exposure liquid come to be greatly different in physicality, so the resist film suffers bubbles and liquid residues generated during the immersion light exposure due to the residual part of the cleaning liquid. Further, since high refractive index liquids have a high viscosity, it may be difficult to satisfactorily remove the light exposure liquid by cleaning performed after the immersion light exposure. Accordingly, where a high refractive index liquid is used as a light exposure liquid, the conventional cleaning may deteriorate the process uniformity, when performed before and after the immersion light exposure.

On the other hand, in light of the cost and environment, the consumption of the light exposure liquid and cleaning liquid should be smaller. Particularly, since high refractive index liquids are expensive in general, a process performed by use of a high refractive index liquid is strongly required to decrease the consumption thereof. In order to decrease the consumption of the light exposure liquid and cleaning liquid, these liquids may be recycled by circulation. However, where the light exposure liquid and cleaning liquid are recycled by circulation, each of these liquids requires a mechanism and treatment for regenerating used liquid, which complicate the entire apparatus and process.

BRIEF SUMMARY OF THE INVENTION

An object of the present invention is to provide a circulation system for a high refractive index liquid in a pattern forming apparatus, which can decrease the consumption of a cleaning liquid as well as the high refractive index liquid used as a light exposure liquid, without complicating the apparatus and process.

Another object of the present invention is to provide a circulation system for a high refractive index liquid in a pattern forming apparatus, which can prevent the process uniformity on a substrate from being deteriorated.

Another object of the present invention is to provide a pattern forming apparatus and pattern forming method using such a circulation system for a high refractive index liquid, and a computer readable storage medium that stores a control program for executing the pattern forming method.

According to a first aspect of the present invention, there is provided a circulation system for a high refractive index liquid in a pattern forming apparatus for forming a predetermined resist pattern on a substrate, the apparatus comprising a resist coating/developing section configured to perform a series of processes including resist coating onto the substrate to form a resist film and development of the resist film after light exposure, and including a cleaning section configured to perform cleaning on the substrate after the resist coating and before the light exposure and/or the substrate after the light exposure and before the development, and an immersion light exposure section configured to perform the light exposure on the resist film in accordance with a predetermined pattern while immersing the resist film formed on the substrate in a high refractive index liquid having a refractive index higher than water, the circulation system comprising: a first collecting section configured to collect the high refractive index liquid used in the immersion light exposure section; a first supply section configured to supply the high refractive index liquid collected in the first collecting section to the cleaning section as the cleaning liquid; a second collecting section configured to collect the high refractive index liquid used in the cleaning section; a second supply section configured to supply the high refractive index liquid collected in the second collecting section to the immersion light exposure section; and a control section configured to control an operation of the circulation system, wherein the control section executes control for the high refractive index liquid to be circulated between the immersion light exposure section and the cleaning section, such that the high refractive index liquid is collected from the immersion light exposure section to the first collecting section, then supplied from the first supply section to the cleaning section for use in cleaning, then collected from the cleaning section to the second collecting section, and then supplied from the second supply section to the immersion light exposure section for use in immersion light exposure.

In the first aspect of the present invention, the circulation system is preferably arranged such that at least one of the first collecting section and the first supply section and at least one of the second collecting section and the second supply section respectively include storage tanks configured to temporarily store the high refractive index liquid, and the storage tanks store a volatilization-preventive liquid for preventing the high refractive index liquid from being volatilized, the volatilization-preventive liquid having a smaller specific gravity than the high refractive index liquid and being separative from the high refractive index liquid. The circulation system preferably further comprises a filter configured to filtrate the high refractive index liquid after collection in the second collecting section and before supply from the second supply section. The circulation system preferably further comprises a degasifying member configured to degasify the high refractive index liquid after collection in the second collecting section and before supply from the second supply section. The circulation system preferably further comprises a temperature adjusting mechanism configured to adjust to a predetermined temperature the high refractive index liquid after collection in the second collecting section and before supply from the second supply section. In this case, the temperature adjusting mechanism may include, in order from a upstream side to a downstream side in a direction in which the high refractive index liquid flows, a first temperature adjusting portion configured to adjust the high refractive index liquid approximately to the predetermined temperature after collection in the second collecting section, and a second temperature adjusting portion configured to adjust the high refractive index liquid, which has been adjusted approximately to the predetermined temperature by the first temperature adjusting portion, precisely to the predetermined temperature. The high refractive index liquid preferably has a refractive index of 1.5 or higher.

According to a second aspect of the present invention, there is provided a pattern forming apparatus for forming a predetermined resist pattern on a substrate, the apparatus comprising: a resist coating/developing section configured to perform a series of processes including resist coating onto the substrate to form a resist film and development of the resist film after light exposure, and including a cleaning section configured to perform cleaning on the substrate after the resist coating and before the light exposure and/or the substrate after the light exposure and before the development; an immersion light exposure section configured to perform the light exposure on the resist film in accordance with a predetermined pattern while immersing the resist film formed on the substrate in a high refractive index liquid having a refractive index higher than water; a high refractive index liquid circulation mechanism configured to circulate the high refractive index liquid in use; and a control section configured to control an operation of the pattern forming apparatus, wherein the cleaning section is configured to perform cleaning of the substrate by use of the high refractive index liquid, the high refractive index liquid circulation mechanism includes a first collecting section configured to collect the high refractive index liquid used in the immersion light exposure section, a first supply section configured to supply the high refractive index liquid collected in the first collecting section to the cleaning section as the cleaning liquid, a second collecting section configured to collect the high refractive index liquid used in the cleaning section, and a second supply section configured to supply the high refractive index liquid collected in the second collecting section to the immersion light exposure section, and the control section executes control for the high refractive index liquid to be circulated between the immersion light exposure section and the cleaning section, such that the high refractive index liquid is collected from the immersion light exposure section to the first collecting section, then supplied from the first supply section to the cleaning section for use in cleaning, then collected from the cleaning section to the second collecting section, and then supplied from the second supply section to the immersion light exposure section for use in immersion light exposure.

In the second aspect of the present invention, the pattern forming apparatus may be arranged such that the resist coating/developing section includes a process station configured to perform a series of processes including resist coating onto the substrate to form a resist film and development of the resist film after light exposure, and an interface station interposed between the process station and the immersion light exposure section, and including the cleaning section disposed therein and a transfer mechanism configured to transfer the substrate between the process station, the immersion light exposure section, and the cleaning section, and wherein the immersion light exposure section is set at a positive pressure relative to the interface station, while the interface station is provided with a capture mechanism configured to capture volatilized components of the high refractive index liquid. In this case, the capture mechanism is preferably configured to extract an organic component from volatilized components of the high refractive index liquid captured therein, and to supply the organic component to at least one of the first collecting section, the first supply section, the second collecting section, and the second supply section.

According to a third aspect of the present invention, there is provided a pattern forming method for forming a predetermined resist pattern, the method comprising: performing resist coating on a substrate by a resist coating section, thereby forming a resist film; performing light exposure on the resist film in accordance with a predetermined pattern by an immersion light exposure section, while immersing the resist film formed on the substrate in a high refractive index liquid having a refractive index higher than water; performing development of the resist film by a development section after light exposure; and performing cleaning by a cleaning section on the substrate after the resist coating and before the light exposure and/or the substrate after the light exposure and before the development, wherein the high refractive index liquid is circulated between the immersion light exposure section and the cleaning section, such that the high refractive index liquid used for the light exposure is collected from the immersion light exposure section and is then used for the cleaning, while the high refractive index liquid used for the cleaning is collected from the cleaning section and is then used for the light exposure.

In the third aspect of the present invention, the pattern forming method preferably further comprises temporarily storing the high refractive index liquid, collected from the immersion light exposure section and the cleaning section, in respective storage tanks before use in the cleaning and the light exposure, wherein the storage tanks store a volatilization-preventive liquid for preventing the high refractive index liquid from being volatilized, the volatilization-preventive liquid having a smaller specific gravity than the high refractive index liquid and being separative from the high refractive index liquid. The pattern forming method preferably further comprises filtrating the high refractive index liquid collected from the cleaning section before use in the light exposure. The pattern forming method preferably further comprises degasifying the high refractive index liquid collected from the cleaning section before use in the light exposure. The pattern forming method preferably further comprises adjusting to a predetermined temperature the high refractive index liquid collected from the cleaning section before use in the light exposure. The high refractive index liquid preferably has a refractive index of 1.5 or higher.

According to a fourth aspect of the present invention, there is provided a computer readable storage medium that stores a control program for execution on a computer, the control program, when executed, causing the computer to control a processing apparatus to conduct a pattern forming method for forming a predetermined resist pattern, the method comprising: performing resist coating on a substrate by a resist coating section, thereby forming a resist film; performing light exposure on the resist film in accordance with a predetermined pattern by an immersion light exposure section, while immersing the resist film formed on the substrate in a high refractive index liquid having a refractive index higher than water; performing development of the resist film by a development section after light exposure; and performing cleaning by a cleaning section on the substrate after the resist coating and before the light exposure and/or the substrate after the light exposure and before the development, wherein the high refractive index liquid is circulated between the immersion light exposure section and the cleaning section, such that the high refractive index liquid used for the light exposure is collected from the immersion light exposure section and is then used for the cleaning, while the high refractive index liquid used for the cleaning is collected from the cleaning section and is then used for the light exposure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
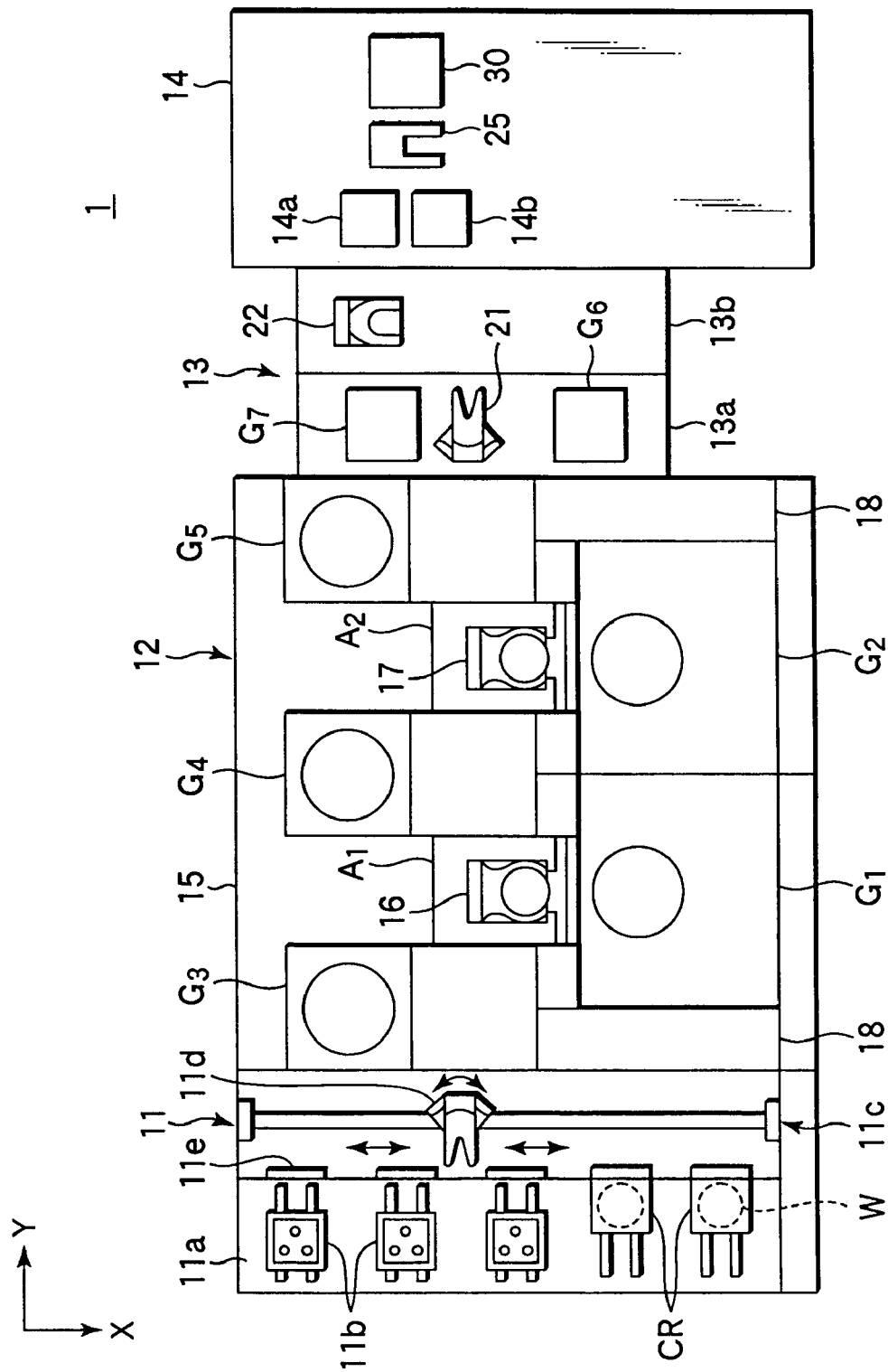
FIG. 1 is a plan view schematically showing a substrate processing apparatus or pattern forming apparatus according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
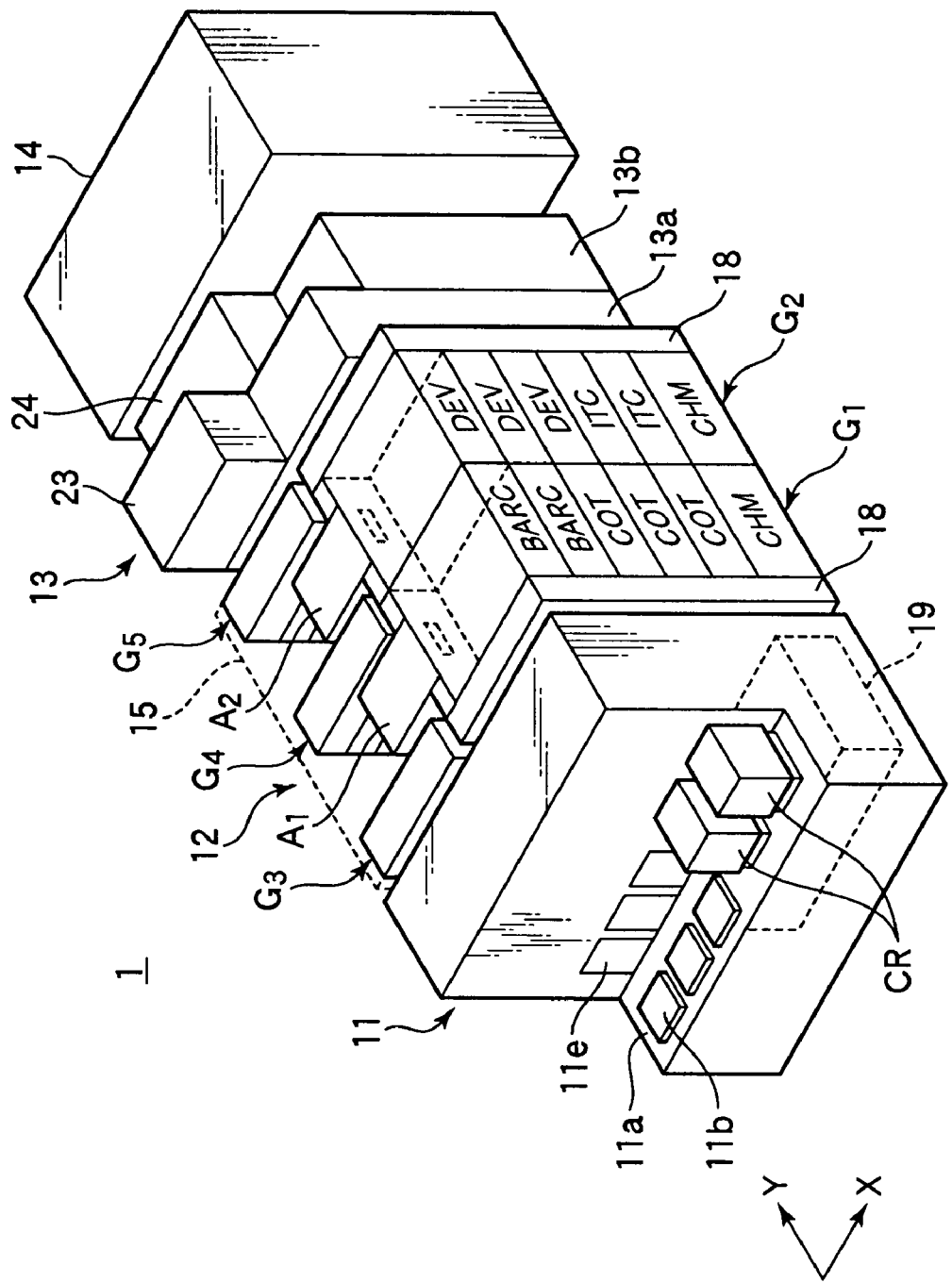
FIG. 2 is a perspective view schematically showing the pattern forming apparatus.

FIG. 1 is a plan view schematically showing a substrate processing apparatus or pattern forming apparatus according to an embodiment of the present invention. FIG. 2 is a perspective view schematically showing the pattern forming apparatus. The pattern forming apparatus 1 is designed to form a predetermined resist pattern on a semiconductor substrate or wafer W. This pattern forming apparatus 1 includes a cassette station 11 used as a transfer station for wafers W, a process station 12 comprising a plurality of processing units each for performing a predetermined process on a wafer W, a light exposure apparatus 14 for performing a light exposure process on a wafer W, and an interface station 13 for transferring wafers W between the process station 12 and light exposure apparatus 14. The cassette station 11, process station 12, interface station 13, and light exposure apparatus 14 are arrayed in series in this order in the longitudinal direction of the pattern forming apparatus 1 (Y-direction).

The cassette station 11 includes a cassette table 11a for placing thereon wafer cassettes (CR) each storing a plurality of, e.g., 13 wafers W, and a wafer transfer mechanism 11c for transferring wafers W between the wafer cassettes (CR) placed on the cassette table 11a and a transition unit located in a third processing unit group $G_3$ in the process station 12 described later. The cassette table 11a and wafer transfer mechanism 11c are arrayed in series in this order in the Y-direction. The cassette table 11a has a plurality of, e.g., five positioning portions 11b each for positioning a wafer cassette (CR), arrayed thereon in the width direction of the pattern forming apparatus 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transition unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, and three resist coating units (COT) for forming a resist film on a wafer W. The second processing unit group $G_2$ includes a plurality of processing units stacked one on the other, which are formed of, e.g., three development units (DEV) for performing a developing process on a wafer W, and two top coating units (ITC) for forming a protection film having water repellency on a resist film formed on a wafer W.

Each of the third processing unit group $G_3$, fourth processing unit group $G_4$, and fifth processing unit group $G_5$ includes a plurality of processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transition unit through which wafers W are transferred between the cassette station 11 and first main transfer section $A_1$. The fifth processing unit group $G_5$ includes a transition unit through which wafers W are transferred between the second main transfer section $A_2$ and a first wafer transfer member 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Chemical solution pumps 18 are respectively disposed between the first processing unit group $G_1$ and cassette station 11 and between the second processing unit group $G_2$ and interface station 13, for supplying process liquids to the first and second processing unit groups $G_1$ and $G_2$. Chemical unit (CHM) are respectively disposed below the first and second processing unit groups $G_1$ and $G_2$, for supplying chemical solutions to the first and second processing unit groups $G_1$ and $G_2$.

Figure 3:
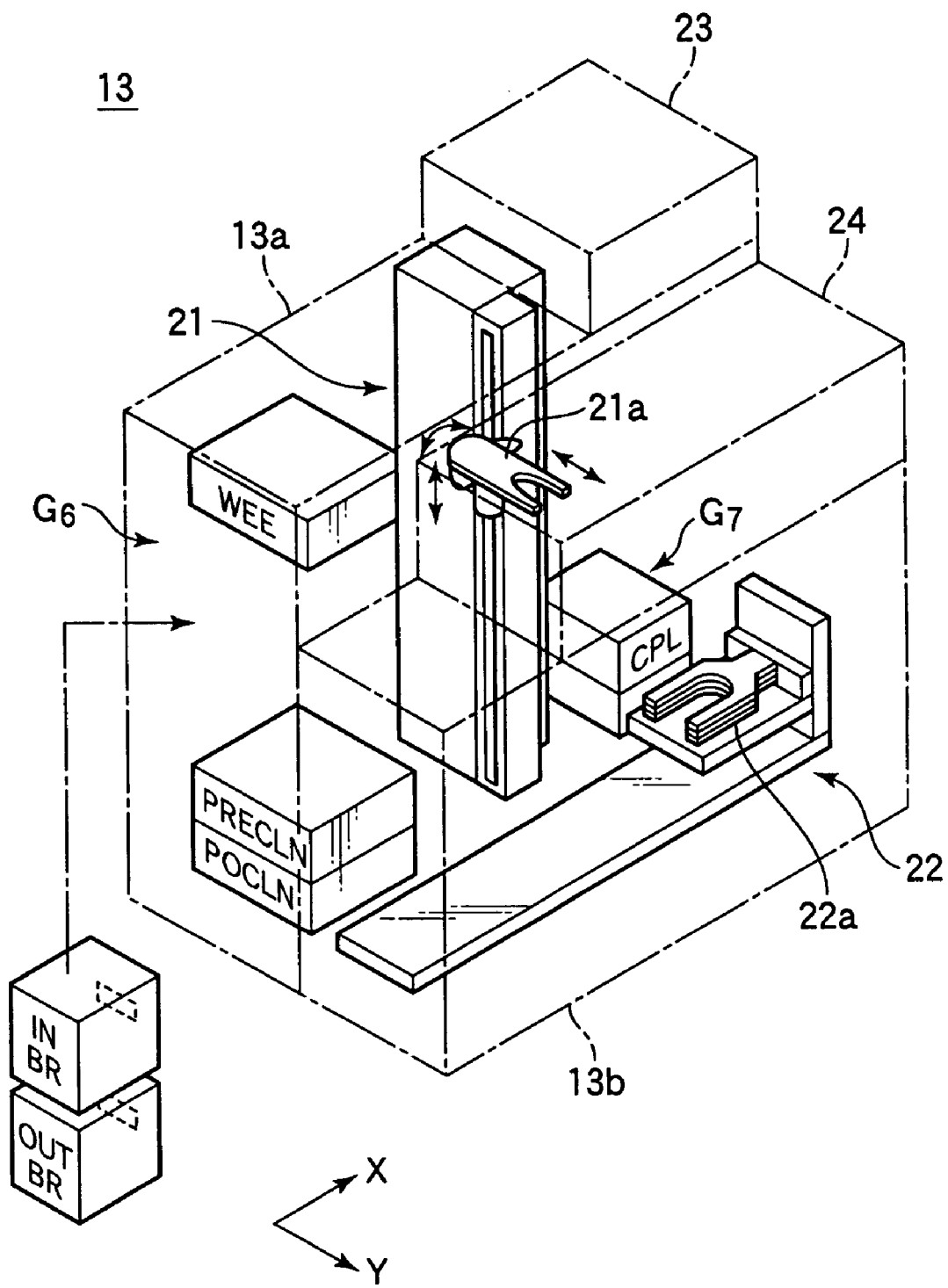
FIG. 3 is a perspective view schematically showing an interface station used in the pattern forming apparatus.

FIG. 3 is a perspective view schematically showing the interface station 13 used in the pattern forming apparatus 1. The interface station 13 has a casing that defines a first interface station 13a on the process station 12 side and a second interface station 13b on the light exposure apparatus 14 side. The first interface station 13a is provided with a first wafer transfer member 21 disposed to face an opening portion of the fifth processing unit group $G_5$ for transferring wafers W. The second interface station 13b is provided with a second wafer transfer member 22 movable in the X-direction for transferring wafers W.

A sixth processing unit group $G_6$ is located on the front side of the first interface station 13a, and includes, e.g., a periphery light exposure unit (WEE), an incoming buffer cassette (INBR), an outgoing buffer cassette (OUTBR), a pre-cleaning unit (PRECLN), and a post-cleaning unit (POCLN), stacked one on the other. The periphery light exposure unit (WEE) is used for performing light exposure selectively only on the edge portion of a wafer W to remove unnecessary resist portion near the edge of the wafer. The incoming buffer cassette (INBR) is used for temporarily placing wafers W to be transferred into the light exposure apparatus 14. The outgoing buffer cassette (OUTBR) is used for temporarily placing wafers W transferred from the light exposure apparatus 14. The pre-cleaning unit (PRECLN) is used for cleaning a wafer to be transferred into the light exposure apparatus 14. The post-cleaning unit (POCLN) is used for cleaning a wafer transferred from the light exposure apparatus 14. A seventh processing unit group $G_7$ is located on the rear side of the first interface station 13a, and includes, e.g., two high-precision temperature adjusting units (CPL), stacked one on the other, for adjusting the temperature of a wafer W with high precision.

The first wafer transfer member 21 includes a fork 21a for transferring wafers W. The fork 21a can selectively access the units located in the fifth processing unit group $G_5$, sixth processing unit group $G_6$, and seventh processing unit group $G_7$ to transfer wafers W between these units.

The second wafer transfer member 22 includes a fork 22a for transferring wafers W. The fork 22a can selectively access the pre-cleaning unit (PRECLN) and post-cleaning unit (POCLN) of the sixth processing unit group $G_6$, the units located in the seventh processing unit group $G_7$, and an incoming stage 14a and an outgoing stage 14b of the light exposure apparatus 14 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

As described above, the process station 12 includes the resist coating units (COT) for applying a resist onto a wafer W to form a film, the development units (DEV) for developing a resist film after light exposure performed by the light exposure apparatus 14, and so forth. The interface station 13 includes the pre-cleaning unit (PRECLN) for cleaning a wafer W after resist coating and before light exposure, and the post-cleaning unit (POCLN) for cleaning a wafer W after light exposure and before development. Accordingly, the process station 12 and interface station 13 constitute a resist coating/developing section.

The light exposure apparatus 14 includes an incoming stage 14a for placing thereon wafers W transferred from the interface station 13, and an outgoing stage 14b for placing thereon wafers W to be transferred to the interface station 13. The light exposure apparatus 14 further includes an immersion light exposure section 30 structured to subject a resist film formed on a wafer W to light exposure while immersing the resist film in a predetermined liquid. A wafer transfer mechanism 25 is disposed to transfer wafers W between the incoming stage 14a, immersion light exposure section 30, and outgoing stage 14b.

Figure 4:
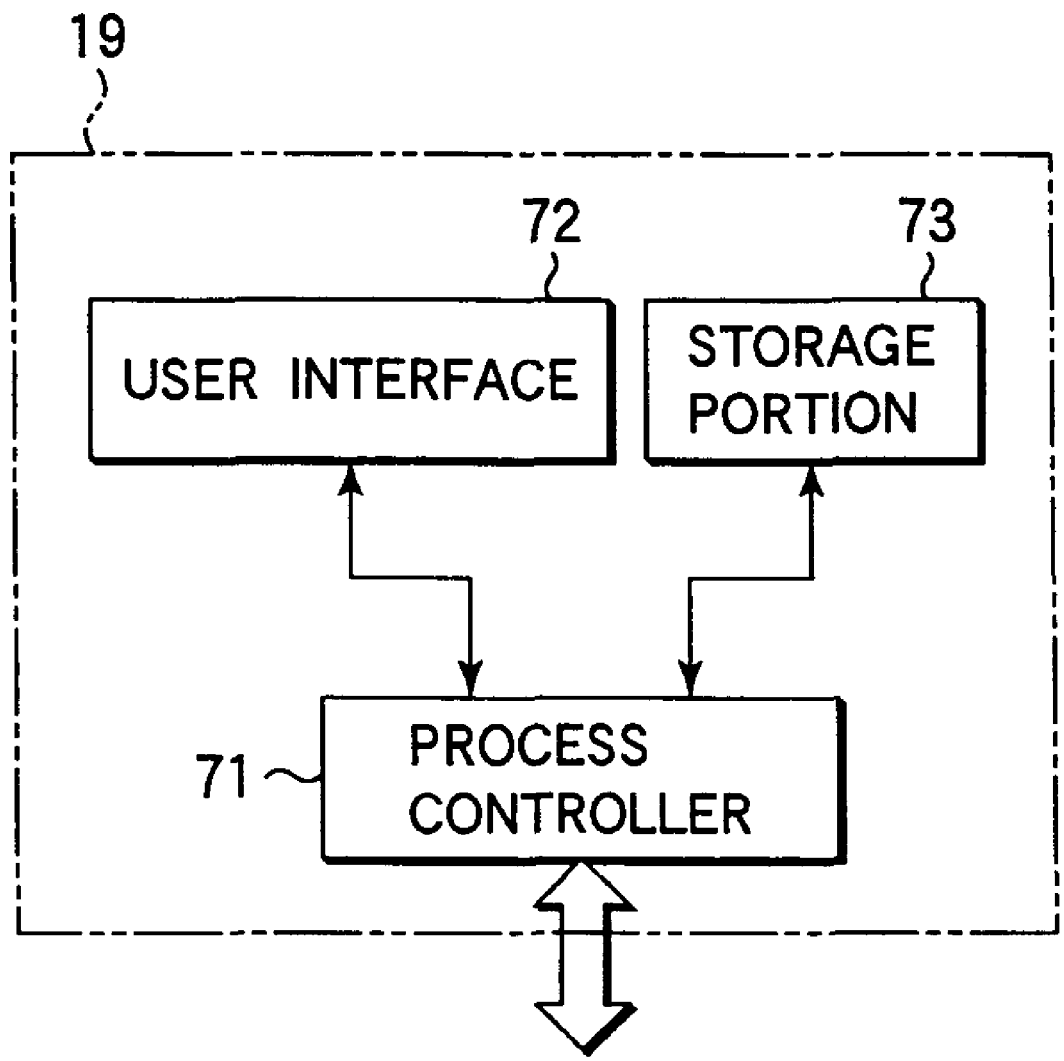
FIG. 4 is a block diagram showing a control system used in the pattern forming apparatus.

As shown in FIG. 2, a central control section 19 is located below the cassette station 11 and is used for controlling this pattern forming apparatus 1, as a whole, including a high refractive index liquid circulation mechanism 9 described later and so forth. As shown in FIG. 4, this central control section 19 includes a process controller 71 comprising a micro processor for controlling the respective components included in the pattern forming apparatus 1, such as the processing units and transfer mechanisms. The process controller 71 is connected to the user interface 72, which includes, e.g., a keyboard and a display, wherein the keyboard is used for a process operator to input commands for operating the respective components in the pattern forming apparatus 1, and the display is used for showing visualized images of the operational status of the respective components in the pattern forming apparatus 1. Further, the process controller 71 is connected to the storage portion 73, which stores control programs for realizing various processes performed in the pattern forming apparatus 1 under the control of the process controller 71, and programs or recipes for the respective components in the pattern forming apparatus 1 to perform processes in accordance with process conditions. Recipes are stored in the storage medium or media of storage portion 73. For example, the storage medium or media are formed of a hard disc, a semiconductor memory, and/or a portable medium, such as a CDROM, DVD, or flash memory. Further, recipes may be transmitted from another apparatus through, e.g., a dedicated line, as needed.

A required recipe is retrieved from the storage portion 73 and executed by the process controller 71 in accordance with an instruction or the like input through the user interface 72. Consequently, each of various predetermined processes is performed in the pattern forming apparatus 1 under the control of the process controller 71. Each of the processing units is provided with its own subordinate unit controller, which controls the operation of the corresponding unit in accordance with instructions transmitted from the process controller 71.

In the pattern forming apparatus 1 arranged as described above, wafers W are taken out one by one from a wafer cassette (CR) by the transfer pick 11d of the wafer transfer mechanism 11c. A wafer W thus taken out is transferred by the transfer pick 11d into the transition unit of the third processing unit group $G_3$ of the process station 12. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to an adhesion process in the adhesion unit, formation of a resist film in one of the resist coating units (COT), formation of a protection film in one of the top coating units (ITC), and a pre-baking process in the pre-baking unit in this order. In place of the adhesion process, the wafer W may be subjected to formation of an anti-reflective coating in one of the bottom coating units (BARC), or formation of an anti-reflective coating on a resist film and formation of a protection film on the anti-reflective coating.

After the wafer W is subjected to a series of processes in the process station 12, the wafer W is transferred to the transition unit of the fifth processing unit group $G_5$. Then, the wafer W is sequentially transferred by the first wafer transfer member 21 through the periphery light exposure unit (WEE), incoming buffer cassette (INBR), pre-cleaning unit (PRECLN), and high-precision temperature adjusting unit (CPL), so that the wafer W is subjected to a series of processes. Then, the wafer W is transferred by the second wafer transfer member 22 to the incoming stage 14a of the light exposure apparatus 14. Then, the wafer W is transferred by the wafer transfer mechanism 25 to the immersion light exposure section 30, in which the wafer W is subjected to a light exposure process.

After the light exposure is finished in the immersion light exposure section 30, the wafer W is transferred by the wafer transfer mechanism 25 to the outgoing stage 14b. Then, the wafer W is transferred by the second wafer transfer member 22 to the post-cleaning unit (POCLN), in which the wafer W is subjected to cleaning. Thereafter, the wafer W is transferred by the first wafer transfer member 21 to the transition unit of the fifth processing unit group $G_5$. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to a post-exposure baking process in the post-exposure baking unit, a developing process in one of the development units (DEV), and a post-baking process in the post-baking unit in this order. Then, the wafer W is transferred to the transition unit of the third processing unit group $G_3$, and is further transferred to a wafer cassette (CR) placed on the cassette station 11.

Next, a detailed explanation will be given of the immersion light exposure section 30, pre-cleaning unit (PRECLN), and post-cleaning unit (POCLN) of the light exposure apparatus 14.

Figure 5:
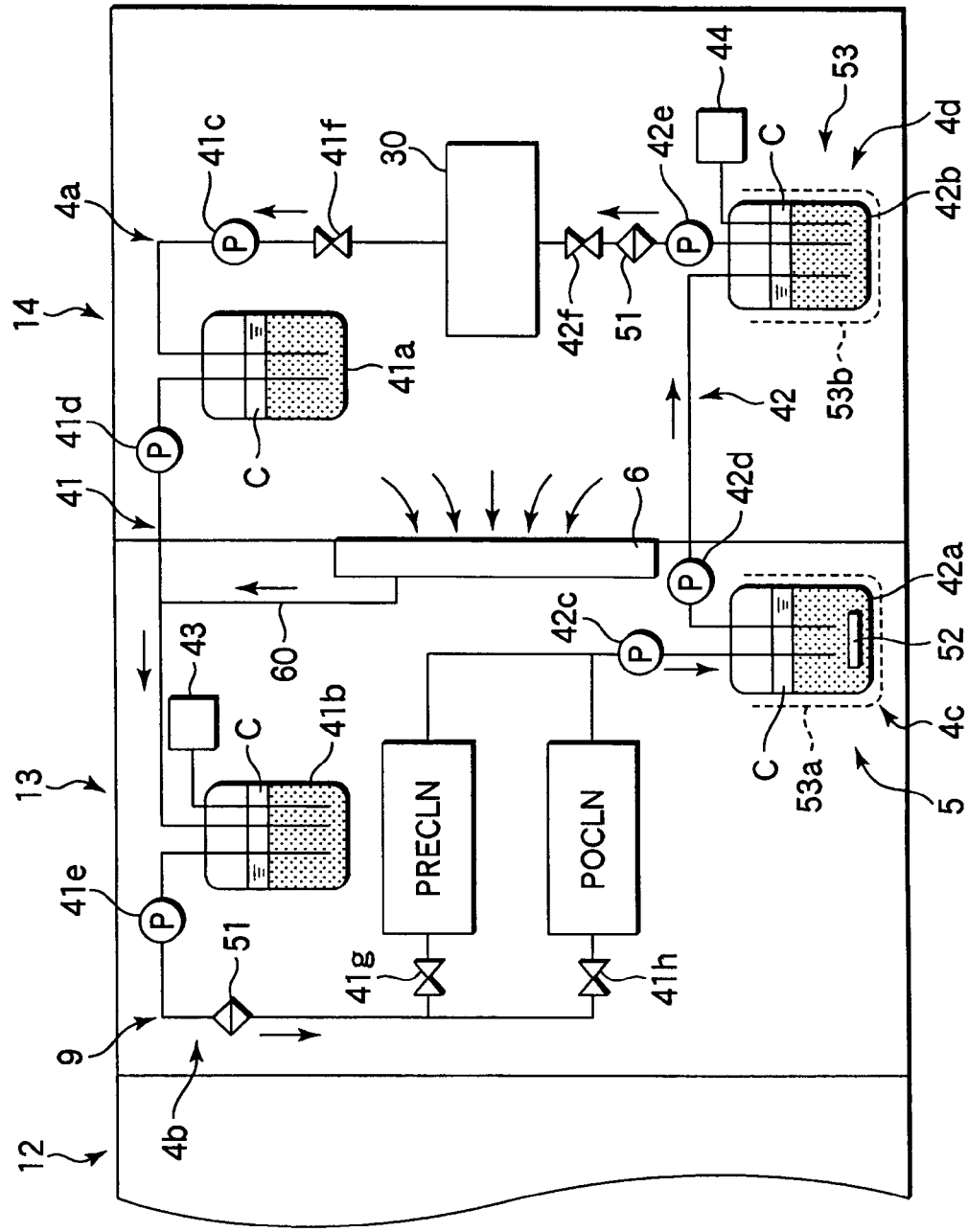
FIG. 5 is a view schematically showing main portions of the interface station and light exposure apparatus used in the pattern forming apparatus.
Figure 6:
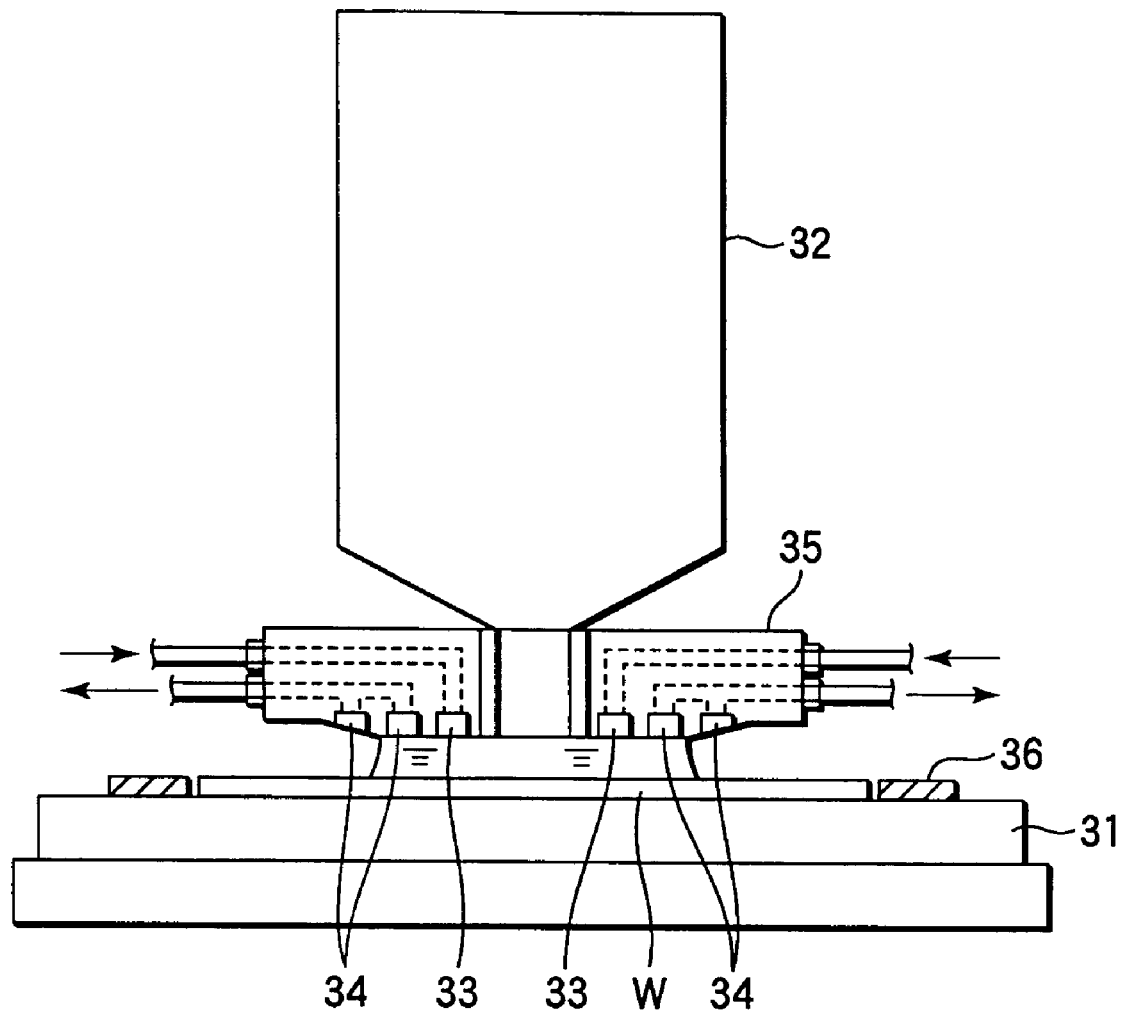
FIG. 6 is a sectional view schematically showing a light exposure section used in the light exposure apparatus.
Figure 7:
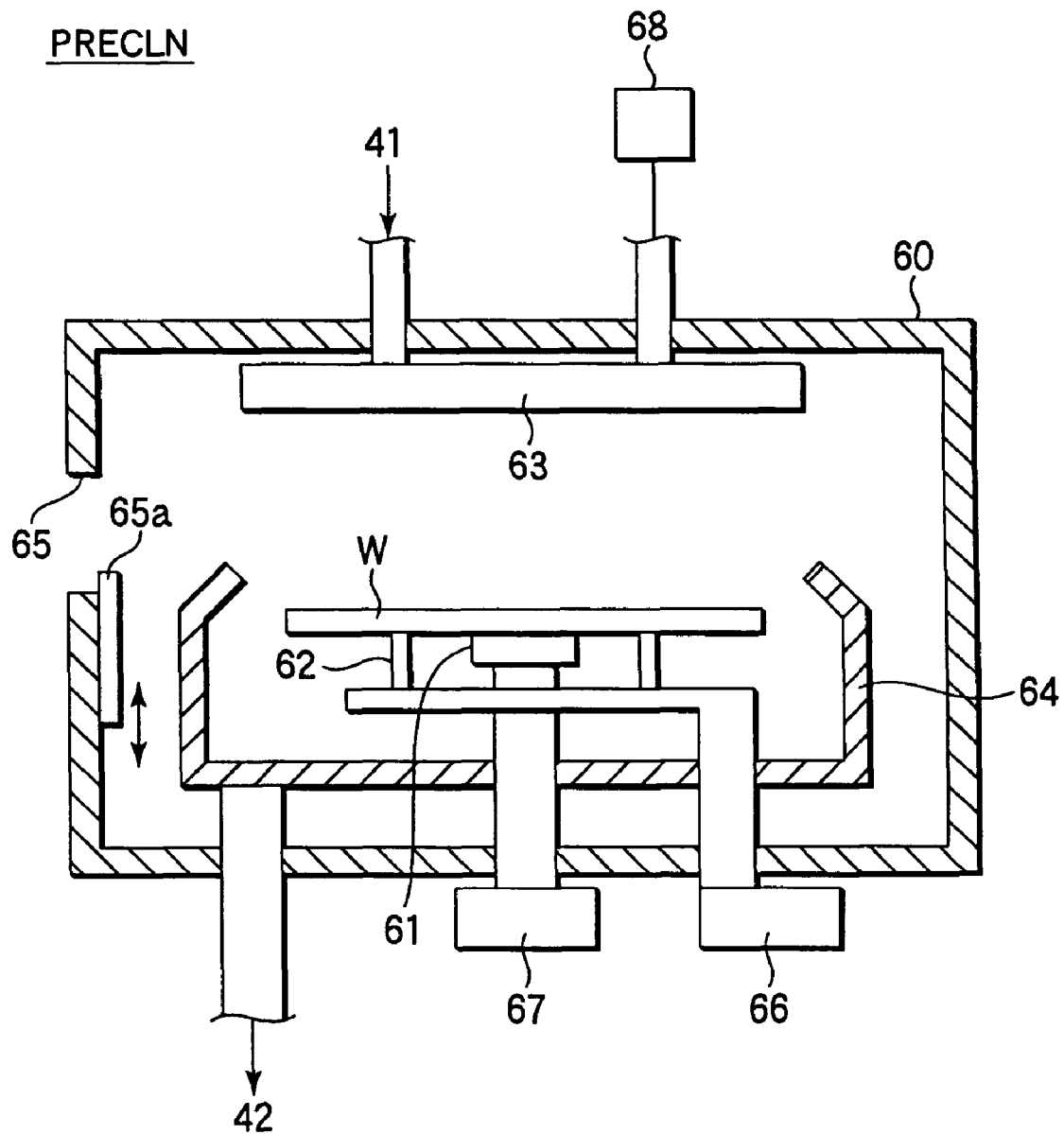
FIG. 7 is a sectional view schematically showing a pre-cleaning unit used in the interface station.

FIG. 5 is a view schematically showing main portions of the interface station 13 and light exposure apparatus 14 of the pattern forming apparatus 1. FIG. 6 is a sectional view schematically showing the immersion light exposure section 30 of the light exposure apparatus 14. FIG. 7 is a sectional view schematically showing the pre-cleaning unit (PRECLN) located in the interface station 13.

The immersion light exposure section 30 is designed to perform so-called immersion light exposure, i.e., to subject a resist film to light exposure in accordance with a predetermined pattern while immersing the resist film in a high refractive index liquid. The high refractive index liquid has a refractive index higher than purified water (having a refractive index of 1.44), and preferably has a refractive index of not less than 1.5. For example, this liquid is a liquid compound comprising a cyclic hydrocarbon skeleton (having a refractive index of 1.63). Each of the pre-cleaning unit (PRECLN) and post-cleaning unit (POCLN) is structured to perform cleaning on a wafer W by use of a high refractive index liquid the same as or of the same type as that used in the immersion light exposure section 30. For this reason, as shown in FIG. 5, a high refractive index liquid circulation mechanism 9 (a circulation system for the high refractive index liquid) is disposed over the interface station 13 and light exposure apparatus 14 to use the high refractive index liquid while circulating it between the immersion light exposure section 30 and the pre-cleaning unit (PRECLN) and post-cleaning unit (POCLN).

The high refractive index liquid circulation mechanism 9 includes a first transportation line 41 for transporting the high refractive index liquid used in the immersion light exposure section 30 to the pre-cleaning unit (PRECLN) and post-cleaning unit (POCLN). The circulation mechanism 9 also include a second transportation line 42 for transporting the high refractive index liquid used in the pre-cleaning unit (PRECLN) and post-cleaning unit (POCLN) to the immersion light exposure section 30. A liquid regeneration mechanism 5 is disposed to regenerate the high refractive index liquid transported through the second transportation line 42.

As shown in FIG. 6, the immersion light exposure section 30 includes an openable chamber (not shown) and a stage 31 located in the chamber for placing thereon a wafer W. A projection lens 32 is disposed to project a mask pattern image, obtained by irradiation with light exposure light from a light source (not shown), onto the wafer W placed on the stage 31 to perform light exposure. Supply ports 33 and collection ports 34 for the high refractive index liquid used as a light exposure liquid are formed in a light exposure liquid distribution member 35, such that the light exposure liquid is supplied from the supply ports 33 into the gap between the wafer W placed on the stage 31 and the projection lens 32, and is then collected from the collection ports 34.

The stage 31 is movable in a horizontal direction and slightly rotatable. The stage 31 is provided with an annular projection to surround the wafer W placed thereon, so that the wafer W is held by the annular projection 36, and the light exposure liquid supplied on the wafer W is prevented from flowing out. The projection lens 32 magnifies and projects a mask pattern image at a predetermined magnification onto the wafer W for light exposure. As the light exposure light emitted from the light source, far ultraviolet light, such as KrF excimer laser light, or vacuum ultraviolet light, such as ArF excimer laser light, is used. The light exposure liquid distribution member 35 has an annular shape to surround the distal or lower end of the projection lens 32. The supply ports 33 and collection ports 34 are formed at intervals in annular directions on the bottom of the distribution member 35. The light exposure liquid distribution member 35 is connected to the first and second transportation lines 41 and 42 such that the supply ports 33 communicate with the second transportation line 42 and the collection ports 34 communicate with the first transportation line 41. Accordingly, the light exposure liquid transported through the second transportation line 42 is supplied from the supply ports 33, while the light exposure liquid collected from the collection ports 34 is transported through the first transportation line 41.

The immersion light exposure section 30 having the structure described above is operated, as follows. Specifically, when a wafer W is placed on the stage 31 by the wafer transfer mechanism 25, the stage 31 and/or mask are horizontally moved, as needed. Further, the high refractive index liquid is supplied from the supply ports 33 of the light exposure liquid distribution member 35 into the gap between the wafer W and projection lens 32. In this state, a mask pattern image is projected from the projection lens 32 onto the wafer W to subject the wafer W to an immersion light exposure process. At this time, the high refractive index liquid supplied into the gap between the wafer W and projection lens 32 is collected through the collection ports 34 into the first transportation line 41. In this embodiment, since the high refractive index liquid is used for the immersion light exposure, the wavelength of the light exposure light is significantly shortened, thereby attaining a high resolution. After the immersion light exposure is performed for a predetermined time, supply of the light exposure liquid is stopped, and the wafer W is transferred from the stage 31 to the outgoing stage 14*b* by the wafer transfer mechanism 25.

As shown in FIG. 7, the pre-cleaning unit (PRECLN) includes a chamber 60 for accommodating a wafer W, a spin chuck 61 located inside the chamber 60 to hold and rotate the wafer W in a horizontal state, and a lifter pins 62 movable up and down to transfer the wafer W between the first wafer transfer member 21 or second wafer transfer member 22 and the spin chuck 61. A showerhead 63 is disposed to deliver and supply a cleaning liquid comprising a high refractive index liquid, and a purge gas, such as nitrogen gas, onto the wafer W held by the spin chuck 61. The showerhead 63 is connected to a purge gas supply mechanism 68 for supplying the purge gas. A collection cup 64 is disposed to receive the cleaning liquid spilt from the wafer W and/or thrown off from the wafer W.

The chamber 60 has transfer ports 65 formed in, e.g., sidewalls each with a shutter 65*a* for opening/closing it, to allow the first wafer transfer member 21 and second wafer transfer member 22 for transferring the wafer W to pass therethrough. The lifter pins 62 can be moved up and down by an elevating mechanism 66 to transfer the wafer W inside the chamber 60 between the first wafer transfer member 21 or second wafer transfer member 22 and the spin chuck 61. The spin chuck 61 is configured to hold the wafer W at the center of the back side (lower surface) of the wafer W by a vacuum attraction force, and rotate the wafer W by a rotary mechanism 67, such as a motor. The showerhead 63 is connected to the first transportation line 41, so that the cleaning liquid transported through the first transportation line 41 is supplied onto the front side (upper surface) of the wafer W held on the spin chuck 61. The collection cup 64 is disposed to surround the wafer W held on the spin chuck 61 and is connected to the second transportation line 42, so that the cleaning liquid received thereby is transported through the second transportation line 42.

The post-cleaning unit (POCLN) has a structure equivalent to the pre-cleaning unit (PRECLN).

The pre-cleaning unit (PRECLN) having the structure described above is operated, as follows. Specifically, when a wafer W is transferred from one transfer port 65 into the chamber 60, the elevating mechanism 66 is moved up and down to transfer the wafer W onto the spin chuck 61, and the shutter 65*a* is moved to close the transfer port 65. Then, while the wafer W is rotated by the spin chuck 61, the cleaning liquid is supplied from the showerhead 63 onto the wafer W to clean the wafer W. Then, while the wafer W is rotated, the purge gas is supplied from the showerhead 63 onto the wafer W to dry the wafer W. At this time, the cleaning liquid spilt or thrown off from the wafer W is received by the collection cup 64, and is collected through the second transportation line 42. After the wafer W is dried, the other shutter 65*a* is moved to open the other transfer port 65, and the wafer W is transferred out of the chamber 60 through the transfer port 65. According to this embodiment, the cleaning of the wafer W is performed before the immersion light exposure, while using as the cleaning liquid a high refractive index liquid the same as or of the same type as that used as the light exposure liquid in the immersion light exposure. Consequently, the affinity of the wafer W relative to the light exposure liquid is improved, so that the resist film is prevented from suffering bubbles and liquid residues generated during the immersion light exposure due to the residual part of the cleaning liquid.

Further, since the high refractive index liquid has a high viscosity (higher than purified water) and easily adheres to the wafer W during the immersion light exposure, it would be difficult to satisfactorily remove the light exposure liquid by cleaning using purified water conventionally performed after the immersion light exposure. However, according to this embodiment, the cleaning of the wafer W is performed after the immersion light exposure, while using as the cleaning liquid a high refractive index liquid the same as or of the same type as that used as the light exposure liquid in the immersion light exposure. Consequently, even where the high refractive index liquid used as the light exposure liquid is left on the wafer W, the residual part can be satisfactorily removed by means of the liquid pressure and viscosity of the high refractive index liquid delivered from the showerhead 63.

As shown in FIG. 5, the first transportation line 41 includes a first storage tank 41*a* located on the upstream side to store the high refractive index liquid, and a second storage tank 41*b* located on the downstream side to store the high refractive index liquid. A first pump 41*c* is disposed to send the high refractive index liquid used in the immersion light exposure section 30 to the first storage tank 41*a*. A second pump 41*d* is disposed to send the high refractive index liquid stored in the first storage tank 41a to the second storage tank 41b. A third pump 41e is disposed to send the high refractive index liquid stored in the second storage tank 41b to the pre-cleaning unit (PRECLN) and post-cleaning unit (POCLN). A first valve 41f is disposed to adjust the flow rate of the high refractive index liquid to be sent to the first storage tank 41a. A second valve 41g is disposed to adjust the flow rate of the high refractive index liquid to be sent to the pre-cleaning unit (PRECLN). A third valve 41h is disposed to adjust the flow rate of the high refractive index liquid to be sent to the post-cleaning unit (POCLN). On the other hand, the second transportation line 42 includes a first storage tank 42a located on the upstream side to store the high refractive index liquid, and a second storage tank 42b located on the downstream side to store the high refractive index liquid. A first pump 42c is disposed to send the high refractive index liquid collected from the pre-cleaning unit (PRECLN) and post-cleaning unit (POCLN) to the first storage tank 42a. A second pump 42d is disposed to send the high refractive index liquid stored in the first storage tank 42a to the second storage tank 42b. A third pump 42e is disposed to send the high refractive index liquid stored in the second storage tank 42b to the immersion light exposure section 30. A valve 42f is disposed to adjust the flow rate of the high refractive index liquid to be sent to the immersion light exposure section 30.

In general, high refractive index liquids are highly volatile, each of the first storage tanks 41a and 42a and the second storage tanks 41b and 42b stores a volatilization-preventive liquid C to prevent volatilization of the high refractive index liquid. The volatilization-preventive liquid C is a substance, such as water, which has a specific gravity smaller than the high refractive index liquid and is separative from the high refractive index liquid.

For example, the second pumps 41d and 42d are configured to send the high refractive index liquid inside the first storage tanks 41a and 42a to the second storage tanks 41b and 42b, respectively, when the high refractive index liquid exceeds a predetermined amount inside the first storage tanks 41a and 42a.

The second storage tanks 41b and 42b are respectively connected to fresh liquid supply lines 43 and 44 for replenishing a fresh high refractive index liquid into the second storage tanks 41b and 42b. For example, the fresh liquid supply lines 43 and 44 are arranged to replenish a fresh high refractive index liquid set at a predetermined temperature into the second storage tanks 41b and 42b, respectively, when the high refractive index liquid inside the first storage tanks 41a and 42a becomes less than a predetermined amount, and the high refractive index liquid inside the second storage tanks 41b and 42b becomes less than a predetermined amount, at the same time.

The upstream end side structure of the first transportation line 41 including the first storage tank 41a, first pump 41c, and first valve 41f constitutes a first collecting section 4a for collecting the high refractive index liquid used in the immersion light exposure section 30. The downstream end side structure of the first transportation line 41 including the second storage tank 41b, third pump 41e, second valve 41g, and third valve 41h constitutes a first supply section 4b for supplying the high refractive index liquid collected in the first collecting section to the pre-cleaning unit (PRECLN) and post-cleaning unit (POCLN), individually. The upstream end side structure of the second transportation line 42 including the first storage tank 42a and first pump 42c constitutes a second collecting section 4c for collecting the high refractive index liquid used in the pre-cleaning unit (PRECLN) and post-cleaning unit (POCLN). The downstream end side structure of the second transportation line 42 including the second storage tank 42b, third pump 42e, and valve 42f constitutes a second supply section 4d for supplying the high refractive index liquid collected in the second collecting section to the immersion light exposure section 30.

The liquid regeneration mechanism 5 includes filters 51 for filtrating the high refractive index liquid flowing through the first transportation line 41 and second transportation line 42, respectively, a degasifying member 52 for degasifying the high refractive index liquid flowing through the second transportation line 42, and a temperature adjusting mechanism 53 for adjusting the high refractive index liquid flowing through the second transportation line 42 to a predetermined temperature.

The filters 51 are used for filtration of the high refractive index liquid to be supplied to the immersion light exposure section 30, and filtration of the high refractive index liquid to be supplied to the pre-cleaning unit (PRECLN) and post-cleaning unit (POCLN). For example, the filters 51 are respectively located at a position downstream the second storage tank 41b of the first transportation line 41 and at a position downstream the second storage tank 42b of the second transportation line 42. The degasifying member 52 is located at a position, e.g., inside the first storage tank 42a to degasify the high refractive index liquid inside the first storage tank 42a. For example, the temperature adjusting mechanism 53 includes a first temperature adjusting portion 53a configured to adjust the high refractive index liquid approximately to a predetermined temperature inside the first storage tank 42a, and a second temperature adjusting portion 53b configured to adjust the high refractive index liquid, which has been adjusted approximately to the predetermined temperature by the first temperature adjusting portion 53a, precisely to the predetermined temperature inside the second storage tank 42b.

The high refractive index liquid circulation mechanism 9 having the structure described above is operated, as follows. Specifically, the high refractive index liquid is collected from the immersion light exposure section 30 to the first collecting section 4a, and is then supplied from the first supply section 4b to the pre-cleaning unit (PRECLN) and post-cleaning unit (POCLN), individually, for use in cleaning. Then, the high refractive index liquid is collected from the pre-cleaning unit (PRECLN) and post-cleaning unit (POCLN) to the second collecting section 4c, and is then supplied from the second supply section 4d to the immersion light exposure section 30 for use in immersion light exposure. Thus, the high refractive index liquid is circulated between the immersion light exposure section 30 and the pre-cleaning unit (PRECLN) and post-cleaning unit (POCLN).

The interface station 13 is provided with a capture mechanism 6 configured to capture volatilized components of the high refractive index liquid. The interior of the light exposure apparatus 14 (or the immersion light exposure section 30) is set at a positive pressure relative to the interface station 13. Since the high refractive index liquids is highly volatile, as described above, volatilized components of the high refractive index liquid could easily enter the interface station 13 and the process station 12 through the interface station 13. If volatilized components of the high refractive index liquid enter the process station 12, wafers W may be adversely affected. In this respect, according to this embodiment, the capture mechanism 6 is disposed to capture volatilized components of the high refractive index liquid inside the interface station 13 and volatilized components of the high refractive index liquid flowing from the light exposure apparatus 14 toward the interface station 13, thereby preventing wafers W from being adversely affected. Volatilized components of the high refractive index liquid captured by the capture mechanism 6 may be discarded after a detoxification process. However, in this embodiment, only organic components of volatilized components are extracted therefrom, and are supplied through a supply line 60 to at lease one of the first transportation line 41 and second transportation line 42, so that recycling efficiency of the high refractive index liquid is further improved. For example, the capture mechanism 6 may be designed such that, after organic components are extracted from volatilized components of the high refractive index liquid, the other gas is exhausted out of the apparatus.

According to this embodiment, as described above, the pre-cleaning unit (PRECLN) and post-cleaning unit (POCLN) are disposed to perform cleaning of a wafer W by use of a high refractive index liquid, before and after the immersion light exposure process performed by the light exposure apparatus 14 or immersion light exposure section 30 by use the high refractive index liquid. Consequently, the affinity of the wafer W relative to the light exposure liquid is improved, while the light exposure liquid is satisfactorily removed from the wafer W, thereby preventing the process uniformity on the wafer W from being deteriorated.

According to this embodiment, the high refractive index liquid used in the light exposure apparatus 14 or immersion light exposure section 30 is collected in the first transportation line 41, and is then supplied to the pre-cleaning unit (PRECLN) and post-cleaning unit (POCLN). Further, the high refractive index liquid used in the pre-cleaning unit (PRECLN) and post-cleaning unit (POCLN) is collected in the second transportation line 42, and is then supplied to the immersion light exposure section 30. Consequently, the high refractive index liquid is recycled by circulation between the immersion light exposure section 30 and the pre-cleaning unit (PRECLN) and post-cleaning unit (POCLN), so that the consumption of the light exposure liquid and cleaning liquid which comprise the high refractive index liquid can be decreased. Further, it becomes unnecessary to provide a mechanism and treatment for regenerating the light exposure liquid used in the light exposure apparatus 14 or immersion light exposure section 30, independently of a mechanism and treatment for regenerating the cleaning liquid used in the pre-cleaning unit (PRECLN) and post-cleaning unit (POCLN). In this case, the degasifying member 52 for regenerating the high refractive index liquid in circulation and the temperature adjusting mechanism 53 are required only for one of the first transportation line 41 and second transportation line 42, such as the second transportation line 42. This arrangement is preferable in light of the environment, and further allows the raw material cost to be decreased and the apparatus of the cluster tool type to be simplified.

According to this embodiment, the first transportation line 41 and second transportation line 42 are provided with the storage tanks 41a, 41b, 42a, and 42b for temporarily storing the high refractive index liquid, and the storage tanks 41a, 41b, 42a, and 42b are configured to seal the high refractive index liquid by a volatilization-preventive liquid C, such as water (water seal type). In this case, the high refractive index liquid is prevented from being volatilized, thereby improving the recycling efficiency.

According to this embodiment, the second transportation line 42 is provided with the filter 51 for filtrating the high refractive index liquid flowing therethrough, the degasifying member 52 for degasifying the high refractive index liquid flowing therethrough, and the temperature adjusting mechanism 53 for adjusting the high refractive index liquid flowing therethrough to a predetermined temperature. Consequently, the light exposure liquid to be used in the immersion light exposure section 30 is kept fresh, so as to maintain a high quality of the immersion light exposure process, which can be easily affected by the temperature and cleanliness of the light exposure liquid.

According to this embodiment, the temperature adjusting mechanism 53 comprises, from the upstream side of the second transportation line 42 to the downstream side thereof, the first temperature adjusting portion 53a configured to adjust the high refractive index liquid roughly to a predetermined temperature, and the second temperature adjusting portion 53b configured to adjust the high refractive index liquid, which has been adjusted roughly to the predetermined temperature by the first temperature adjusting portion 53a, precisely to the predetermined temperature inside the second storage tank 42b. In this case, the light exposure liquid to be used in the immersion light exposure section 30 can be reliably adjusted to a predetermined temperature, so that the quality of the immersion light exposure process is further improved.

The present invention is not limited to the embodiment described above, and it may be modified in various manners. For example, in the embodiment described above, the high refractive index liquid is circulated between the light exposure section and the pre-cleaning unit and post-cleaning unit. Alternately, the high refractive index liquid may be circulated between the light exposure section and only one of the pre-cleaning unit and post-cleaning unit. The degasifying member and temperature adjusting mechanism may be disposed on the first transportation line, as well as the second transportation line. The cleaning unit and high refractive index liquid circulation mechanism may be integrated with, e.g., the light exposure apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming apparatus for forming a predetermined resist pattern on a substrate, the apparatus comprising:
   a resist coating and developing section configured to perform a series of processes including resist coating onto the substrate to form a resist film and development of the resist film after light exposure, and including a cleaning section configured to perform cleaning on the substrate after the resist coating and before the light exposure and/or the substrate after the light exposure and before the development;
   an immersion light exposure section configured to perform the light exposure on the resist film in accordance with a predetermined pattern while immersing the resist film formed on the substrate in a high refractive index liquid having a refractive index higher than water;
   a high refractive index liquid circulation mechanism configured to circulate the high refractive index liquid in use; and
   a control section configured to control an operation of the pattern forming apparatus,
   wherein the cleaning section is configured to perform cleaning of the substrate by use of the high refractive index liquid,
   the high refractive index liquid circulation mechanism includes a first collecting section configured to collect the high refractive index liquid used in the immersion light exposure section, a first supply section configured to supply the high refractive index liquid collected in the first collecting section to the cleaning section as the cleaning liquid, a second collecting section configured to collect the high refractive index liquid used in the cleaning section, and a second supply section configured to supply the high refractive index liquid collected in the second collecting section to the immersion light exposure section, and the control section executes control for the high refractive index liquid to be circulated between the immersion light exposure section and the cleaning section, such that the high refractive index liquid is collected from the immersion light exposure section to the first collecting section, then supplied from the first supply section to the cleaning section for use in cleaning, then collected from the cleaning section to the second collecting section, and then supplied from the second supply section to the immersion light exposure section for use in immersion light exposure, wherein the resist coating and developing section includes a process station configured to perform a series of processes including resist coating onto the substrate to form a resist film and development of the resist film after light exposure, and an interface station interposed between the process station and the immersion light exposure section, and including the cleaning section disposed therein and a transfer mechanism configured to transfer the substrate between the process station, the immersion light exposure section, and the cleaning section, and wherein the immersion light exposure section is set at a positive pressure relative to the interface station, while the interface station is provided with a capture mechanism configured to capture volatilized components of the high refractive index liquid.

2. The pattern forming apparatus according to claim 1, wherein the capture mechanism is configured to extract an organic component from volatilized components of the high refractive index liquid captured therein, and to supply the organic component to at least one of the first collecting section, the first supply section, the second collecting section, and the second supply section.

3. The pattern forming apparatus according to claim 1, wherein at least one of the first collecting section and the first supply section and at least one of the second collecting section and the second supply section respectively include storage tanks configured to temporarily store the high refractive index liquid, and the storage tanks store a volatilization-preventive liquid having a smaller specific gravity than the high refractive index liquid and being separative from the high refractive index liquid, and are configured to seal the high refractive index liquid by the volatilization-preventive liquid in the storage tanks and thereby to prevent the high refractive index liquid from being volatilized.

4. The pattern forming apparatus according to claim 1, further comprising a filter configured to filtrate the high refractive index liquid after collection in the second collecting section and before supply from the second supply section.

5. The pattern forming apparatus according to claim 1, further comprising a degasifying member configured to degasify the high refractive index liquid after collection in the second collecting section and before supply from the second supply section.

6. The pattern forming apparatus according to claim 1, further comprising a temperature adjusting mechanism configured to adjust to a predetermined temperature the high refractive index liquid after collection in the second collecting section and before supply from the second supply section.

7. The pattern forming apparatus according to claim 6, wherein the temperature adjusting mechanism includes, in order from a upstream side to a downstream side in a direction in which the high refractive index liquid flows, a first temperature adjusting portion configured to adjust the high refractive index liquid approximately to the predetermined temperature after collection in the second collecting section, and a second temperature adjusting portion configured to adjust the high refractive index liquid, which has been adjusted approximately to the predetermined temperature by the first temperature adjusting portion, precisely to the predetermined temperature.

8. The pattern forming apparatus according to claim 1, wherein the high refractive index liquid has a refractive index of 1.5 or higher.

* * * * *